(12) United States Patent
Li et al.

(10) Patent No.: US 7,199,347 B2
(45) Date of Patent: Apr. 3, 2007

(54) LAYERED MICROLENS STRUCTURES AND DEVICES

(75) Inventors: Jin Li, Boise, ID (US); Jiutao Li, Boise, ID (US); Ulrich Boettiger, Boise, ID (US); Loriston Ford, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/244,101

(22) Filed: Oct. 6, 2005

(65) Prior Publication Data

US 2006/0027734 A1    Feb. 9, 2006

Related U.S. Application Data

(62) Division of application No. 10/740,597, filed on Dec. 22, 2003.

(51) Int. Cl.
| | |
|---|---|
| H01L 27/00 | (2006.01) |
| H01J 3/14 | (2006.01) |
| H01J 5/16 | (2006.01) |
| H01J 40/14 | (2006.01) |

(52) U.S. Cl. ............... 250/208.1; 250/216; 359/619
(58) Field of Classification Search ............ 250/208.1, 250/216; 359/619
See application file for complete search history.

(56) References Cited

U.S. PATENT DOCUMENTS

| | | | |
|---|---|---|---|
| 4,689,291 A | 8/1987 | Popovic et al. | |
| 5,595,930 A * | 1/1997 | Baek | ............. 438/60 |
| 5,605,783 A | 2/1997 | Revelli et al. | |
| 5,672,519 A * | 9/1997 | Song et al. | ............... 438/69 |
| 5,754,514 A | 5/1998 | Guerra | |
| 5,871,888 A | 2/1999 | Heremans et al. | |
| 5,910,940 A | 6/1999 | Guerra | |
| 6,171,883 B1 | 1/2001 | Yang-Tung et al. | |
| 6,301,051 B1 | 10/2001 | Sankur | |
| 6,339,506 B1 | 1/2002 | Wakelin et al. | |
| 6,433,844 B2 | 8/2002 | Li | |
| 6,473,238 B1 | 10/2002 | Daniell | |
| 6,495,813 B1 | 12/2002 | Fan et al. | |
| 2001/0033007 A1 | 10/2001 | Tak | |
| 2001/0050737 A1 | 12/2001 | Zong-Fu | |

FOREIGN PATENT DOCUMENTS

| | | |
|---|---|---|
| EP | 1 045 449 A | 10/2000 |
| EP | 1 143 529 A2 | 10/2001 |
| WO | WO 95/08192 A | 3/1995 |

OTHER PUBLICATIONS

Tannas, Lawrence E., Jr., Display Technologies and Applications, Society for Information Display, Applications Seminars, May 16-18, 2000, Long Beach, California.

* cited by examiner

*Primary Examiner*—Stephone B. Allen
*Assistant Examiner*—Patrick J. Lee
(74) *Attorney, Agent, or Firm*—Dickstein Shapiro LLP

(57) ABSTRACT

A microlens structure includes lower lens layers on a substrate. A sputtered layer of glass, such as silicon oxide, is applied over the lower lens layers at an angle away from normal to form upper lens layers that increase the effective focal length of the microlens structure. The upper lens layers can be deposited in an aspherical shape with radii of curvature longer than the lower lens layers. As a result, small microlenses can be provided with longer focal lengths. The microlenses are arranged in arrays for use in imaging devices.

8 Claims, 4 Drawing Sheets

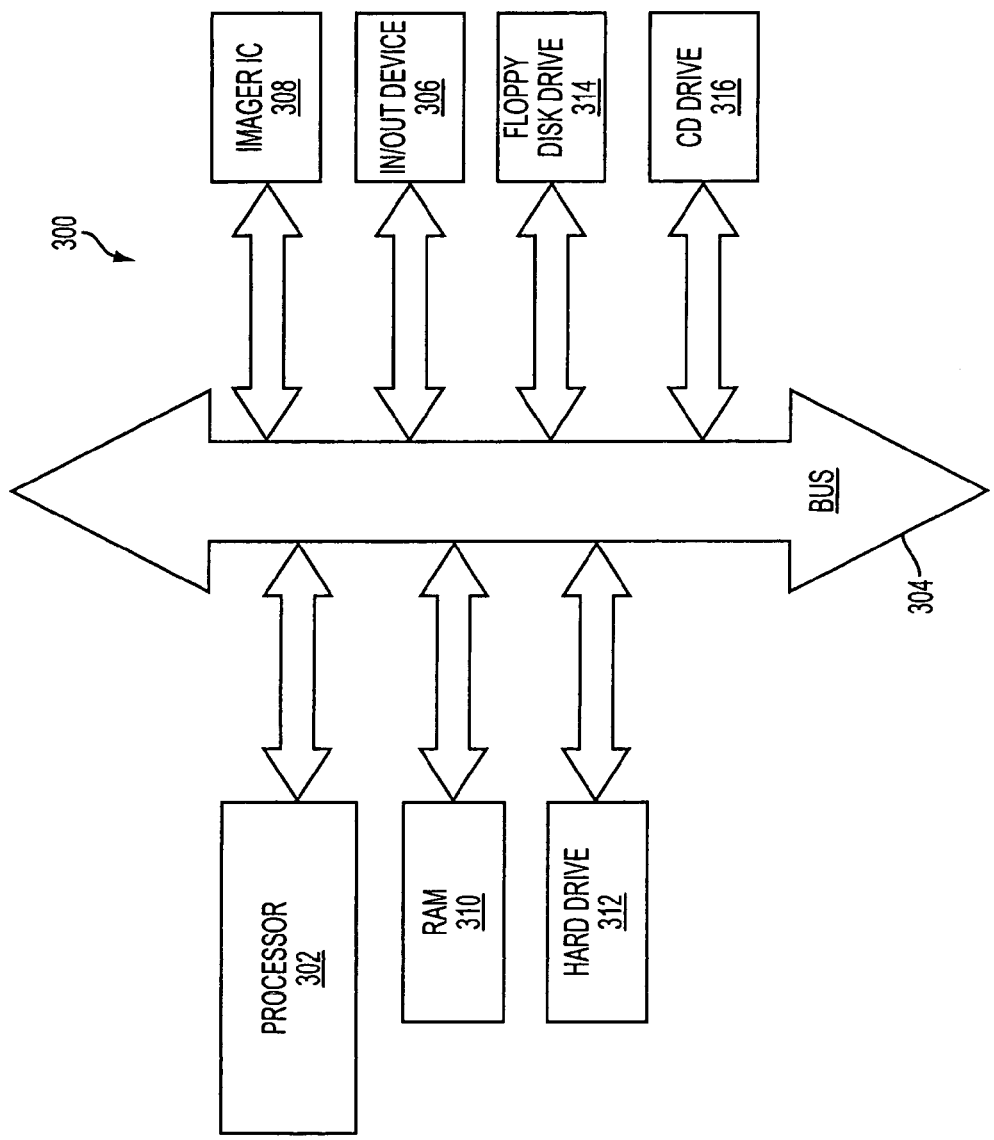

LAYERED MICROLENS STRUCTURES AND DEVICES

This application is a divisional application of Ser. No. 10/740,597, filed Dec. 22, 2003, the subject matter of which is incorporated by reference herein.

FIELD OF THE INVENTION

The present invention relates generally to improved lens structures, and in particular to a microlens system for an imager or display array.

BACKGROUND OF THE INVENTION

The semiconductor industry currently uses different types of semiconductor-based imagers, such as charge coupled devices (CCDs), complementary metal-oxide semiconductor (CMOS) active pixel sensors (APS), photodiode arrays, charge injection devices and hybrid focal plane arrays, among others, in which an array of microlenses causes incident light to converge toward each of an array of pixel elements. Semiconductor displays using microlenses have also been developed.

Microlenses are manufactured using subtractive processes and additive processes. In an additive process, lens material is formed on a substrate, patterned and subsequently formed into microlens shapes.

In conventional additive microlens fabrication, an intermediate material is patterned on a substrate to form a microlens array using a reflow process. Each microlens is separated by a minimum distance from adjacent microlenses, typically no less than 0.3 micrometers. Distances less than 0.3 micrometers may cause unwanted bridging of neighboring microlenses during reflow. In the known process, each microlens is patterned as a single shape, typically square, with gaps around it. Heat is applied during the subsequent step of reflowing, which causes the patterned microlens material to form a gel drop in a partially spherical shape, driven by the force equilibrium of surface tension and gravity. The microlenses then harden in this shape. If the gap between two adjacent gel drops is too narrow, they may touch and merge, or bridge, into one larger drop. The effect of bridging is that it changes the shape of the lenses, which leads to a change in focal length, or more precisely the energy distribution in the focal range. A change in the energy distribution in the focal range leads to a loss in quantum efficiency of, and enhanced cross-talk between, pixels. The gaps also allow unfocused photons through the empty spaces in the microlens array, leading to increased cross-talk between respective photosensors of adjacent pixel cells.

In addition, as the size of imager arrays and photosensitive regions of pixels decreases, it becomes increasingly difficult to provide a microlens capable of focusing incident light rays onto a photosensitive region. This problem is due in part to the increased difficulty in constructing a smaller microlens that has the optimal focal length for the imager device process and that optimally adjusts for optical aberrations introduced as the light passes through the various device layers. Also, it is difficult to correct the distortion created by multiple layered regions above the photosensitive area, for example, color filter regions, which results in increased crosstalk between adjacent pixels. Consequently, smaller imagers with untuned or nonoptimized microlenses do not achieve optimal color fidelity and signal/noise ratios.

It would be advantageous to have improved microlens structures and techniques for producing them.

BRIEF SUMMARY OF THE INVENTION

Exemplary embodiments of the invention provide a microlens structure having at least two differing layers which together produce a desired microlens characteristic. In a two-layer exemplary embodiment, for example, the top layer can have a different shape than the bottom layer, thus obtaining a desired focal property. The top layer can be formed by off-angle deposition, e.g., sputtering, of a transparent glassy material, such as a silicon oxide, over a pre-formed lower layer.

The invention also provides methods of producing microlenses. An exemplary method embodiment includes forming a bottom layer with precursor microlens material such as by photoresist reflow. A top layer is deposited over the precursor microlens material using a glass-forming oxide, for example. Deposition takes place by sputtering the oxide at an angle off normal by about 45°–60°. As a result of depositing the glass at an angle off normal, glass is deposited in greater amounts around the peripheral edges of the precursor material, thereby changing the shape and increasing the effective focal length of the lenses. According to one exemplary two-layer embodiment the resulting shape is aspherical.

These and other features and advantages of various embodiments of the invention will be better understood from the following detailed description, which is provided in connection with the accompanying drawings.

BRIEF DESCRIPTION OF THE DRAWINGS

FIG. 7 is a schematic diagram of a processor system with an imager IC as in FIG. 6.

DETAILED DESCRIPTION OF THE INVENTION

Figure 1:
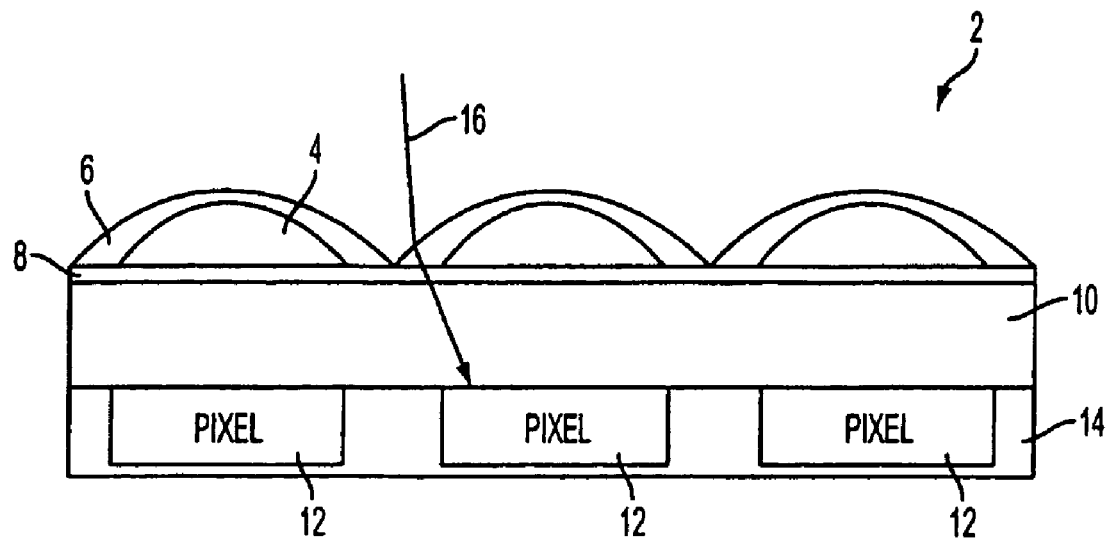
FIG. 1 illustrates a cross sectional view of a portion of a microlens structure in accordance with an exemplary embodiment of the invention, and represents a cross-section taken along line I—I in FIG. 6.

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed, with the exception of steps necessarily occurring in a certain order.

The term "wafer" or "substrate," as used herein, is to be understood as including silicon, silicon-on-insulator (SOI) or silicon-on-sapphire (SOS) technology, doped and undoped semiconductors, epitaxial layers of silicon supported by a base semiconductor foundation, and other semiconductor or insulating structures in, on, or at a surface of which circuitry or optical or electrical devices can be formed. Furthermore, when reference is made to a "wafer" or "substrate" in the following description, previous processing steps may have been utilized to form regions, junctions, or material layers in or over the base semiconductor structure or foundation. In addition, a semiconductor wafer or substrate need not be silicon-based, but could be based on silicon-germanium, germanium, gallium arsenide or other semiconductors.

The term "pixel," as used herein, refers to a picture element unit cell containing a photosensor and other components for converting electromagnetic radiation to an electrical signal. For purposes of illustration, a representative CMOS imager pixel cell is illustrated in the figures and description herein. However, this is just one example of the types of imagers and pixel cells with which the invention may be used. The invention may also be used to create microlens arrays for display devices.

The term "microlens" refers herein to one of an array of optical components over an array of photosensors or photoemitters. In an imager array each microlens tends to focus incident light toward a respective photosensor. A microlens array may be part of a layered structure formed over a substrate using photolithographic techniques. Various processes have been developed for producing microlenses, including fluid self-assembly, droplet deposition, selective curing in photopolymer by laser beam energy distribution, photoresist reflow, direct writing in photoresist, grayscale photolithography, and modified milling. These processes are described in more detail in U.S. Pat. No. 6,473,238 to Daniell, the disclosure of which is incorporated herein by reference.

While the invention is described with particular reference to a semiconductor-based imager, such as a CMOS imager, it should be appreciated that the invention may be applied in any micro-electronic or micro-optical device that includes a microlens, especially one that requires high quality microlenses for optimized performance. Other exemplary micro-optical devices that can include microlenses include CCDs and display devices, as well as others.

Figure 2:
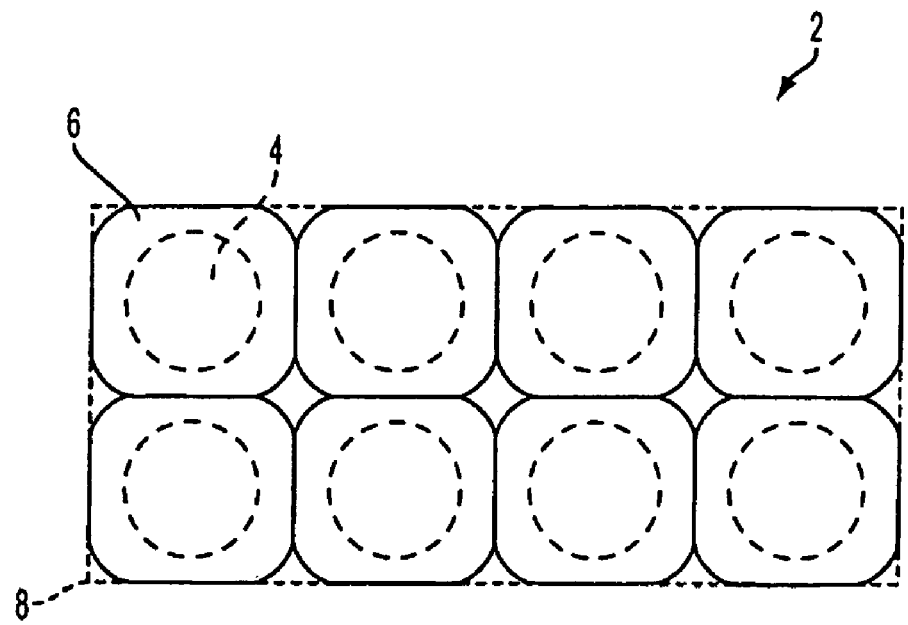
FIG. 2 illustrates a top view of a portion of the FIG. 1 embodiment.

Referring initially to FIGS. 1 and 2, an exemplary embodiment of an imager array 2 is shown illustratively in cross sectional and top views, respectively. A plurality of microlens structures is provided, each having a lower lens region 4 and an upper lens region 6. The microlens structures are provided over passivation layer 8, intervening layer 10 (e.g., color filter array, metallization, etc.), and an array of imaging pixels 12, with one microlens structure over each pixel 12. Each pixel 12 includes a photosensor for converting photons to free electrical charges, and the array 2 also includes structures that obtain electrical signals based on charge levels. Each pixel's microlens is structured in at least two layers, e.g., layers 4 and 6 shown in FIGS. 1 and 2, to increase the pixel's light collection efficiency.

In the illustrated embodiment of FIGS. 1 and 2, the two lens layers 4, 6 in each microlens structure cause light from a larger arc to converge onto a light sensitive photosensor of a respective pixel 12 and to lengthen the effective focal length of each microlens structure. Lower lens layer 4 covers a smaller area of substrate 14 than upper lens layer 6 as shown in FIG. 2, so that a light ray 16 is deflected onto the photosensor of pixel 12 from outside the area of pixel 12, increasing the percentage of incident light that reaches a corresponding photosensor of a pixel 12. In addition, upper layer 6 has a shape that results in different focal properties than lower layer 4.

Figure 3:
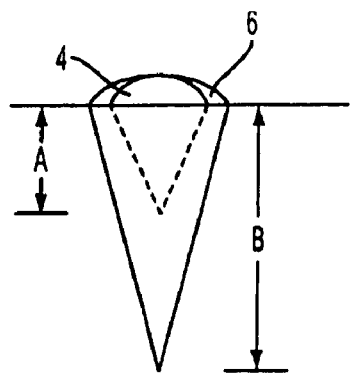
FIG. 3 illustrates the focal lengths of lower and upper lens regions of the microlens structure of FIG. 1.

In the illustrated embodiment, the upper surface of upper layer 6 has radii of curvature longer than the substantially uniform radius of curvature at the upper surface of lower layer 4. As a result, the effective (or average) focal length of each microlens structure is longer than if both layers had the same shape. FIG. 3 illustrates schematically a focal length A of lower layer 4 alone, as compared to a longer focal length B of combined layers 4 and 6. More generally, the upper surface of layer 6 can have a shape that improves efficiency by distributing light onto the photosensor of a pixel in a way that improves conversion of photons to free charge carriers.

The lens layers 4, 6 can be formed into various symmetrical geometric shapes, such as circles, squares, etc., and asymmetrical shapes to provide a path for incident light rays to reach the photo sensors of the pixels 12. FIG. 2 shows the lower lens layer 4 as having a substantially circular cross-section (FIG. 1). Lens layer 6 has a rounded, rectangular perimeter. It should be understood, however, that a variety of shapes for each of layers 4 and 6 may be used in embodiments of the invention, as discussed below.

Referring again to FIG. 2, upper lens layer 6 has an aspherical shape with radial dimensions larger than that of spherical lens layer 4. In the illustrated embodiment, lens layer 6 extends horizontally to a boundary between adjacent microlens structures. Because lens layer 6 is aspherical in shape, the radius of curvature of its upper surface varies with orientation, being near its minimum in the cross section of FIG. 1 and near its maximum along a diagonal cross section (not shown). At all orientations, the radius of curvature is significantly longer than that of lower lens layer 4. As a result, an effective focal length of the lens structure, made up of lens layers 4 and 6, is longer than an effective focal length of lens layer 4 alone.

Lens layers 4 illustratively are substantially spherical and can be formed using a photo resist reflow technique, as is known to those of skill in the art for forming microlenses. The lens layers 4 illustratively are formed from a layer of microlens material, such as photo resist, referred to herein as a "precursor microlens material." Other inorganic, as well as organic and organic-inorganic hybrid materials, also could be used. The precursor microlens material is illustratively coated and patterned upon the passivation layer 8. After patterning, a portion of the material over each pixel has a substantially rectangular or circular configuration and each portion is substantially equal in size with the others. Upon reflow, the precursor microlens material hardens and preferably is impervious to subsequent reflow processes. As a result of the reflow process, the patterned precursor microlens material is transformed into lens layers 4. The lens layers 4 each have a substantially circular perimeter configuration with a spherically curved profile.

The layer 8 upon which the lens layers 4 are formed can be any suitable material that is transparent to electromagnetic radiation in the relevant wavelength range. The lens layers 4, which are also transparent to electromagnetic radiation in the relevant wavelength range, will retain their shape even if a subsequent reflow process is performed. As shown in FIG. 2, there are spaces between the lens layers 4 of adjacent microlenses.

After patterning and reflowing the precursor microlens material to form lower lens layers 4, upper lens layers 6 are formed. Lens layers 6 are deposited over lens layers 4 by an off-angle deposition process, illustrated in FIGS. 4 and 5. In an exemplary embodiment, an $SiO_2$ beam 20 is supplied from a sputtering source 22 through a collimator 24. The $SiO_2$ beam is directed toward a rotating platform 26. Platform 26 supports the substrate 14, on which only two of lens layers 4 are shown in cross-section in FIG. 5, formed on layer 8.

Figure 4:
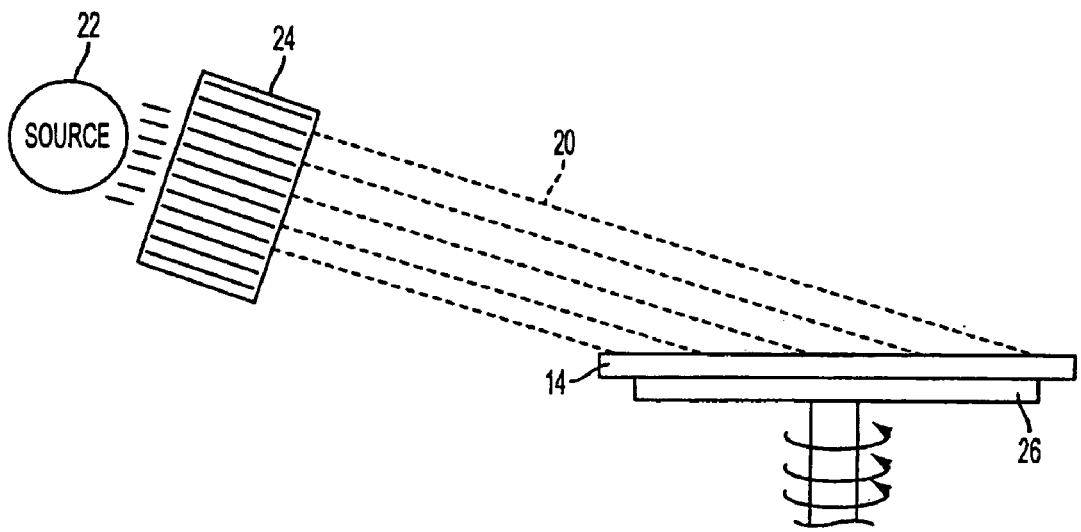
FIG. 4 is a schematic illustration of an apparatus for manufacturing a microlens structure according to an exemplary embodiment of the present invention.
Figure 5:
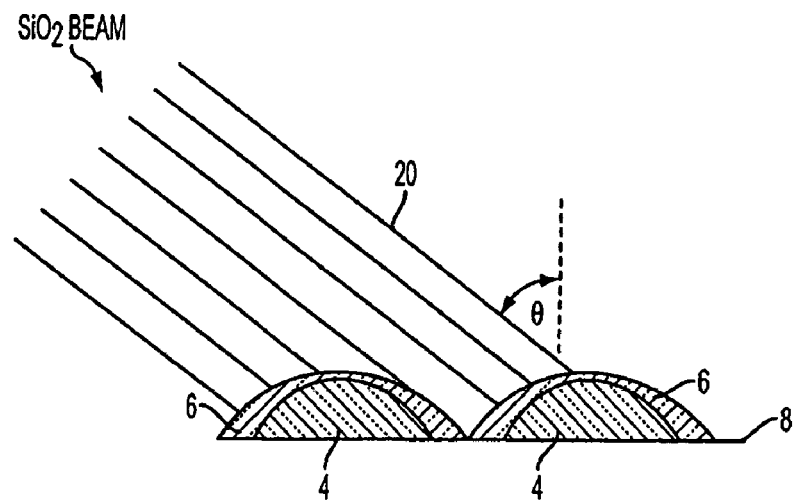
FIG. 5 is a cross-section illustrating a method of manufacturing a microlens structure with the apparatus of FIG. 4.

Platform 26 rotates relative to sputtering source 22 as indicated by the arrows in FIG. 4. Collimated $SiO_2$ is directed toward the rotating platform 26, and condenses as a glass to form lens layers 6 deposited directly on lens layers 4. The speed of rotation of platform 26 can be varied to allow for sufficient deposition of material without disturbing the integrity of the deposited glass.

$SiO_2$ beam 20 is directed at an angle θ away from normal such that most of the glass deposition takes place around the perimeters or peripheral edges of the lens layers 4 and little is deposited at the tops or central surfaces. The angle θ can range between about 0° and about 90°, and preferably is between about 45° and about 60°. Accordingly, the layer of deposited glass on lens layers 6 is thicker toward the bottoms of lens layers 4, near layer 8, than it is toward the tops of lens layers 4. To obtain a rectangular shape as in FIG. 2, the speed of rotation of platform 26 or the rate of emission from source 22 can be varied as a function of orientation of platform 26. Consequently, the shape of the lens structures is changed from that of spherical lens layers 4 such that horizontal aspherical radial dimensions of the lens layers 6 are larger than a horizontal radius of the lens layers 4. As a result of the off-angle deposition, the radius of curvature of the upper surfaces is increased, so that the effective focal length of the lens structures is increased from that of lens layers 4.

Various materials can be used for both the lens layers 4 and 6. Exemplary materials for lens layers 6 are those that provide a substantially transparent layer and are amenable to physical vapor deposition. In addition to $SiO_2$, exemplary materials include nitrides such as $Si_3N_4$, borophosphosilicate glass (BPSG), phosphosilicate glass (PSG), and zinc selenide. Advantageously, a refractive index of the deposited lens layers 6 and the lens layers 4 will be substantially identical to minimize loss of incident light that otherwise would occur as the result of reflections from the interface between layers 6 and 4.

Layers 6 also provide a protective layer for later processes, and can have excellent optical properties. In particular layers 6 can have lower absorption than lower layers 4 formed of an organic microlens material. Further, the layers 6 can protect organic microlenses 4 to prevent cracking, oxidation, aging during high temperature baking processes, and physical or chemical attack in subsequent processes, for example.

Advantageously, deposition continues until gaps between the lens layers 4 are substantially filled with glass, thereby increasing the area of coverage of each lens. Consequently, a greater portion of light incident upon the lens structure array is captured and focused toward pixels 12. The deposition process may take several minutes, for example, depending on the rate of deposition, desired thickness, subsequent processing requirements, etc. Typically, deposition takes place at least until gaps between individual lens in the lower layers 4 are filled. Exemplary, non-limiting thicknesses of the resulting lens layers 6 can be in the range of 0.1–2.0 micrometers, most preferably 0.4–0.8 micrometers, for example.

Figure 6:
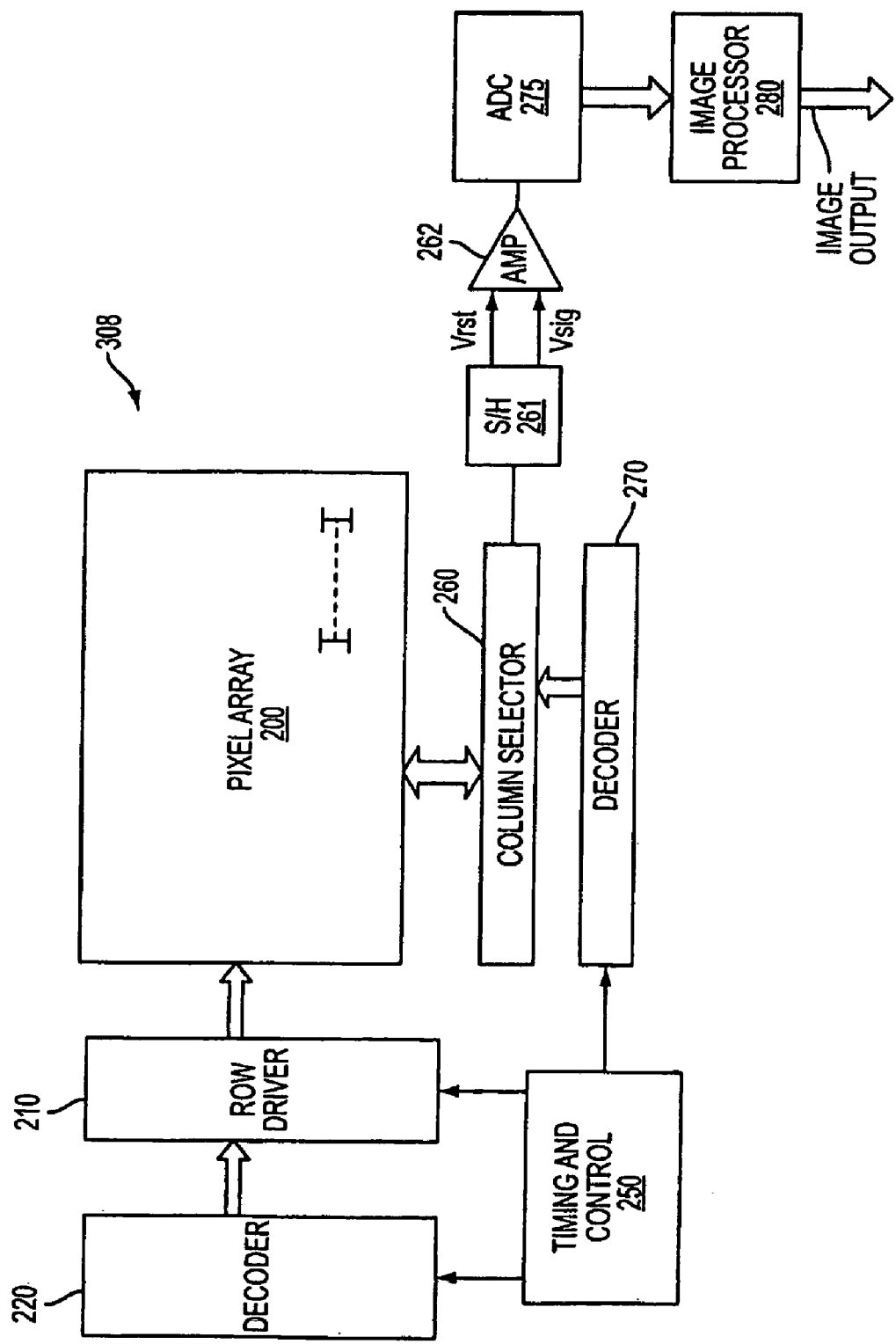
FIG. 6 shows a block diagram of an imager integrated circuit (IC) in accordance with an exemplary embodiment of the invention

FIG. 6 illustrates a block diagram of an imager integrated circuit (IC) 308 having a pixel array 200 containing a plurality of pixels arranged in rows and columns. A cross-section taken along line I—I in array 200 would be the same as the cross-section illustrated in FIG. 1. In other words, pixel array 200 includes at least one microlens structure, illustratively with components as in FIGS. 1 and 2, formed over an associated pixel cell. The pixels of each row in array 200 are all turned on at the same time by a row select line, and the pixels of each column are selectively output by respective column select lines. The row lines are selectively activated by a row driver 210 in response to row address decoder 220. The column select lines are selectively activated by a column selector 260 in response to column address decoder 270.

The pixel array 200 is operated by the timing and control circuit 250, which controls address decoders 220, 270 for selecting the appropriate row and column lines for pixel signal readout. The pixel column signals, which illustratively include a pixel reset signal (Vrst) and a pixel image signal (Vsig), are read by a sample and hold circuit 261 associated with the column selector 260. A differential signal (Vrst–Vsig) is produced by differential amplifier 262 for each pixel, and the differential signal is amplified and digitized by analog to digital converter (ADC) 275. ADC 275 supplies the digitized pixel signals to an image processor 280 which can perform image processing before providing image output signals.

Imager IC 308 can be a CMOS imager or CCD imager, or can be any other type of imager that includes a microlens structure.

FIG. 7 shows system 300, a typical processor based system modified to include an imager IC 308 as in FIG. 6. Processor based systems exemplify systems of digital circuits that could include an imager IC 308. Examples of processor based systems include, without limitation, computer systems, camera systems, scanners, machine vision systems, vehicle navigation systems, video telephones, surveillance systems, auto focus systems, star tracker systems, motion detection systems, image stabilization systems, and data compression systems for high-definition television, any of which could utilize the invention.

System 300 includes an imager IC 308 having the overall configuration depicted in FIG. 6 with array 200 including a microlens structure in accordance with any of the various embodiments of the invention. System 300 includes a processor 302 having a central processing unit (CPU) that communicates with various devices over a bus 304. Some of the devices connected to the bus 304 provide communication into and out of the system 300; an input/output (I/O) device 306 and imager IC 308 are examples of such communication devices. Other devices connected to the bus 304 provide memory, illustratively including a random access memory (RAM) 310, hard drive 312, and one or more peripheral memory devices such as a floppy disk drive 314 and compact disk (CD) drive 316. The imager IC 308 may receive control or other data from CPU 302 or other components of system 300. The imager IC 308 may, in turn, provide signals defining images to processor 302 for image processing, or other image handling operations.

While exemplary embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed is a new and desired to be protected by Letters Patent of the United States is:

1. A microlens comprising:
   a lower lens layer; and
   an upper lens layer over the lower lens layer, wherein the upper lens layer has a radius of curvature longer than the radius of curvature of the lower lens layer, wherein the upper lens layer is formed directly on the lower lens layer.

2. A microlens according to claim 1, wherein the upper lens layer is aspherical.

3. A microlens according to claim 1, in which the lower lens layer has a spherical shape.

4. A microlens comprising:
   a lower lens layer; and
   an upper lens layer over the lower lens layer, wherein the upper lens layer has a radius of curvature longer than the radius of curvature of the lower lens layer, wherein the upper lens layer has a thickness that is greater near a bottom portion of the lower lens layer than at a top portion of the lower lens layer.

5. An image processing system comprising:
   a processor coupled to a bus; and
   an imaging integrated circuit (IC) coupled to the bus, the imaging IC comprising:
      an imaging array containing a plurality of photosensitive regions; and
      a plurality of lens structures provided on the imaging array, each lens structure being over a respective one of the photosensitive regions, at least one lens structure including upper and lower lens layers, the upper lens layer having a radius of curvature longer than the radius of curvature of the lower lens layers, wherein the upper lens layers are formed directly on the respective lower lens layers.

6. The image processing system according to claim 5, wherein the upper lens layer is aspherical.

7. The image processing system according to claim 5, wherein the upper lens layer has a thickness that is greater near a bottom portion of the lower lens layer than at a top portion of the lower lens layer.

8. The image processing system according to claim 5, in which the lower lens layer has a spherical shape.

* * * * *